(12) United States Patent
Zhan et al.

(10) Patent No.: US 10,522,430 B2
(45) Date of Patent: Dec. 31, 2019

(54) SEMICONDUCTOR DEVICE

(71) Applicant: SAMSUNG ELECTRONICS CO., LTD., Suwon-si, Gyeonggi-do (KR)

(72) Inventors: Zhan Zhan, Suwon-si (KR); Hwa Sung Rhee, Seongnam-si (KR); Myung Jo Chun, Hwaseong-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 15/498,924

(22) Filed: Apr. 27, 2017

(65) Prior Publication Data

US 2018/0012814 A1 Jan. 11, 2018

(30) Foreign Application Priority Data

Jul. 5, 2016 (KR) .......... 10-2016-0084813

(51) Int. Cl.
| | |
|---|---|
| H01L 21/66 | (2006.01) |
| G01R 31/26 | (2014.01) |
| H01L 27/02 | (2006.01) |
| H01L 27/06 | (2006.01) |
| H01L 29/66 | (2006.01) |
| H01L 29/861 | (2006.01) |
| G01R 31/28 | (2006.01) |

(52) U.S. Cl.
CPC .......... *H01L 22/32* (2013.01); *G01R 31/2644* (2013.01); *G01R 31/2884* (2013.01); *H01L 22/34* (2013.01); *H01L 27/0207* (2013.01); *H01L 27/0255* (2013.01); *H01L 27/0676* (2013.01); *H01L 29/6609* (2013.01); *H01L 29/861* (2013.01); *H01L 22/14* (2013.01); *H01L 29/8611* (2013.01)

(58) Field of Classification Search
None
See application file for complete search history.

(56) References Cited

U.S. PATENT DOCUMENTS

| | | | | |
|---|---|---|---|---|
| 4,459,437 | A * | 7/1984 | Gabry | H04M 3/301 |
| | | | | 324/520 |
| 4,984,031 | A * | 1/1991 | Rinderle | H01L 27/0248 |
| | | | | 257/272 |
| 6,456,087 | B1 * | 9/2002 | Kamitani | G01R 27/025 |
| | | | | 324/523 |
| 6,938,474 | B2 * | 9/2005 | Melv.ang.s | A61B 5/02158 |
| | | | | 374/E1.008 |
| 7,589,550 | B2 | 9/2009 | Smith | |
| 7,825,652 | B2 | 11/2010 | Miller | |
| 9,121,881 | B2 | 9/2015 | Muecke et al. | |

(Continued)

FOREIGN PATENT DOCUMENTS

| | | |
|---|---|---|
| JP | 2002-033360 A | 1/2002 |
| JP | 2015-023132 A | 2/2015 |

(Continued)

*Primary Examiner* — Telly D Green
(74) *Attorney, Agent, or Firm* — Lee & Morse, P.C.

(57) ABSTRACT

A semiconductor device includes first and second pads separated from each other, first and second test elements connected to the first and second pads and connected to each other in parallel between the first and second pads, a first diode connected to the first test element in series, and a second diode connected to the second test element in series.

20 Claims, 12 Drawing Sheets

(56) References Cited

U.S. PATENT DOCUMENTS

| | | | |
|---|---|---|---|
| 2002/0047552 A1* | 4/2002 | Sano | G09G 3/28 |
| | | | 315/169.2 |
| 2003/0176850 A1* | 9/2003 | Melvas | A61B 5/02158 |
| | | | 604/533 |
| 2007/0200587 A1 | 8/2007 | Doong | |
| 2008/0079404 A1* | 4/2008 | Hayakawa | G01R 19/16542 |
| | | | 323/271 |
| 2009/0179590 A1* | 7/2009 | Yang | H05B 33/0809 |
| | | | 315/297 |
| 2013/0105924 A1* | 5/2013 | Kobayashi | H01L 27/14632 |
| | | | 257/431 |
| 2015/0054532 A1 | 2/2015 | Yoo et al. | |
| 2017/0176358 A1* | 6/2017 | Yeh | G01R 31/307 |

FOREIGN PATENT DOCUMENTS

| | | |
|---|---|---|
| JP | 2015-155825 A | 8/2015 |
| KR | 10-0172442 B1 | 3/1999 |
| KR | 10-2004-0006383 A | 1/2004 |

* cited by examiner

I-I'

II-II'

SEMICONDUCTOR DEVICE

CROSS-REFERENCE TO RELATED APPLICATION

Korean Patent Application No. 10-2016-0084813, filed on Jul. 5, 2016, and entitled, "Semiconductor Device," is incorporated by reference herein in its entirety.

BACKGROUND

1. Field

One or more embodiments described herein relate to a semiconductor device.

2. Description of the Related Art

Test devices for the verification of processes may be provided on wafers during the manufacture of semiconductor devices. The test devices are in limited regions which do not include integrated circuit chips to be manufactured. When the number of test devices is reduced, the number of processes that are able to be verified is also reduced. This may limit quality control and reliability.

SUMMARY

In accordance with one or more embodiments, a semiconductor device includes first and second pads separated from each other; first and second test elements connected to the first and second pads and connected to each other in parallel between the first and second pads; a first diode connected to the first test element in series; and a second diode connected to the second test element in series.

In accordance with one or more other embodiments, a semiconductor device includes a plurality of chip regions, each of which includes at least one integrated circuit chip; and a division region between adjacent ones of the chip regions and including at least one test region, wherein the at least one test region includes: first and second pads separated from each other; first and second test elements connected between the first and second pads and connected to each other in parallel; a first diode, connected between one of the first and second pads and the first test element, to allow current to flow in a first direction; and a second diode, connected between one of the first and second pads and the second test element, to allow current to flow in a second direction different from the first direction.

In accordance with one or more other embodiments, a method of manufacturing a wafer includes preparing a wafer including a plurality of chip regions and a division region between adjacent ones of the chip regions; forming first and second test elements corresponding to first and second semiconductor devices, respectively, in the division region, simultaneously with forming the first and second semiconductor devices in at least one of the chip regions; connecting the first and second test elements to first and second diodes in series, respectively; and forming first and second pads to supply a voltage to the first and second test elements.

In accordance with one or more other embodiments, a method of testing a semiconductor device includes providing first and second pads, first and second test elements connected to the first and second pads and connected to each other in parallel, and first and second diodes connected to the first and second test elements in series, respectively; supplying a voltage to the first and second pads; and verifying the first and second test elements by detecting a level of current flowing in at least one of the first and second test elements.

In accordance with one or more other embodiments, a semiconductor device includes N pads; M test elements; and at least one integrated circuit, wherein the M test elements are connected between the N pads and the at least one integrated circuit is adjacent to the N pads and M test elements, and wherein current is to bi-directionally flow between the N pads through the M test elements at different times, current output by the M test elements indicative of a defect in the semiconductor device.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
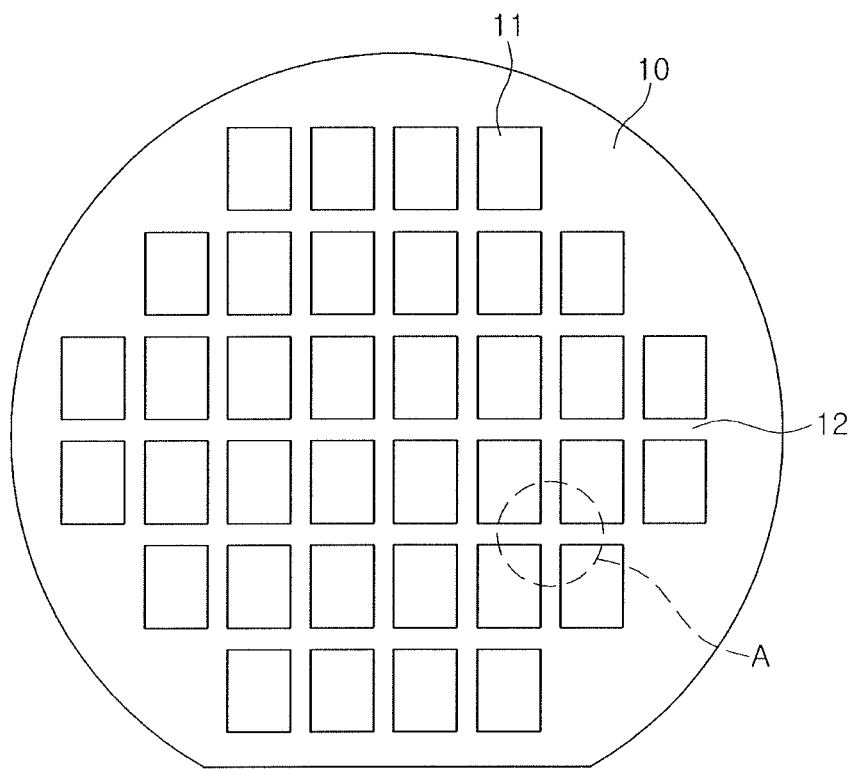
FIG. 1 illustrates an embodiment of a semiconductor device.

FIG. 1 illustrates an embodiment of a semiconductor device 10 which may include a plurality of chip regions 11 and a division region 12 having sections between adjacent ones of the chip regions 11. Each of the chip regions 11 may include at least one integrated circuit chip. One or more circuit elements (e.g., resistors, capacitors, transistors, diodes, etc.) may be in each of the chip regions 11. The chip regions 11 may be arranged in rows and columns.

The division region 12 may allow the chip regions 11 to be separated from one another using, for example, a scribing process for forming individual integrated circuit chips. Circuit elements of the integrated circuit chip may not be in the division region 12. In one embodiment, taking efficiency and reliability of the scribing process into account, the division region 12 may include a plurality of linear portions between respective pairs of adjacent chip regions 11 arranged in rows and columns.

In order to form integrated circuit chips in the chip regions 11, one or more semiconductor processes may be performed. When semiconductor processes are not appropriately performed, open or short defects may occur. This may adversely affect performance of the integrated circuit chips. Thus, a method for determining whether or not a plurality of respective semiconductor processes have been appropriately performed and/or whether the integrated circuit chips have been manufactured without defects may be employed during processes of manufacturing integrated circuit chips.

In an example embodiment, in order to determine whether a manufacturing process for an integrated circuit chip has been properly performed, a test device may be provided in the division region 12. The test device may be a circuit element coupled to or otherwise formed together with one or more capacitors, resistors, transistors, diodes, and/or other circuit elements in the integrated circuit chip. For example, in a process of forming a resistor in an integrated circuit chip, the resistor may be formed together therewith in the division region 12 to configure a test device. The test device may be connected to one pair of pads. Whether open or short defects or the like occur in the test device may be determined by allowing current to flow between one pair of the pads.

Figure 2:
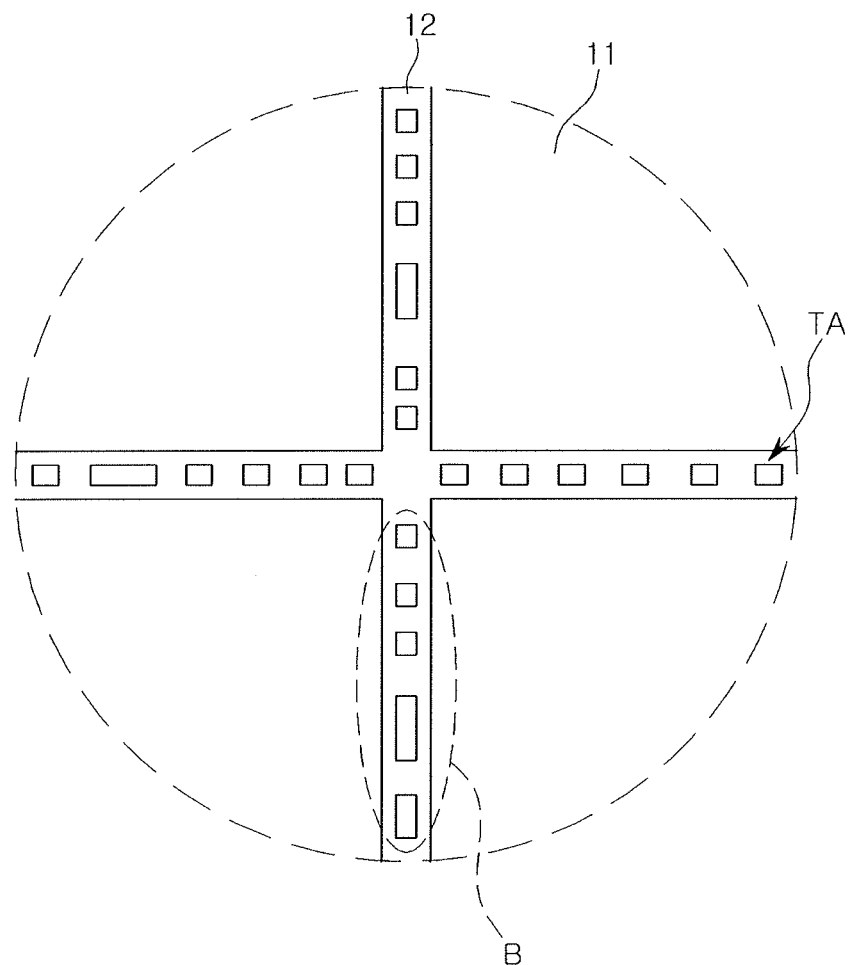
FIG. 2 illustrates an enlarged view of region A in FIG. 1.

FIG. 2 is an enlarged view of region A in FIG. 1. Referring to FIG. 2, the division region 12 may be between a plurality of adjacent chip regions 11. A plurality of test regions TA may be in the division region 12. The test regions TA may be between the chip regions 11 in a direction in which the division region 12 extends. In one embodiment, at least a portion of the test regions TA may overlap at least one of the chip regions 11.

Each test region TA may include a test device, a pad to allow current to flow to the test device, and/or other features. The test device may include at least one of a resistor, a capacitor, or a semiconductor element. In one embodiment, the test device may be an element formed together with a resistor, a capacitor, a semiconductor element, and the like in the chip region 11.

For example, according to an example embodiment, a plurality of chip regions 11 and a division region 12 may be defined on a wafer, and a test device may be formed on the division region 12 simultaneously with formation of a semiconductor device in at least a portion of the chip regions 11. In an example embodiment, when first and second semiconductor elements are in a plurality of chip regions 11, first and second test elements corresponding to the first and second semiconductor elements, respectively, may be in the division region 12 simultaneously therewith.

In order to verify whether or not the first and second test elements are defective, the first and second test elements may be connected to first and second pads. In addition, in order to increase the number of test devices in the division region 12 (which has a limited area), the first and second test elements may be connected to each other in parallel between the first and second pads, and the first and second test elements may be connected to first and second diodes in series, respectively.

Figure 3:
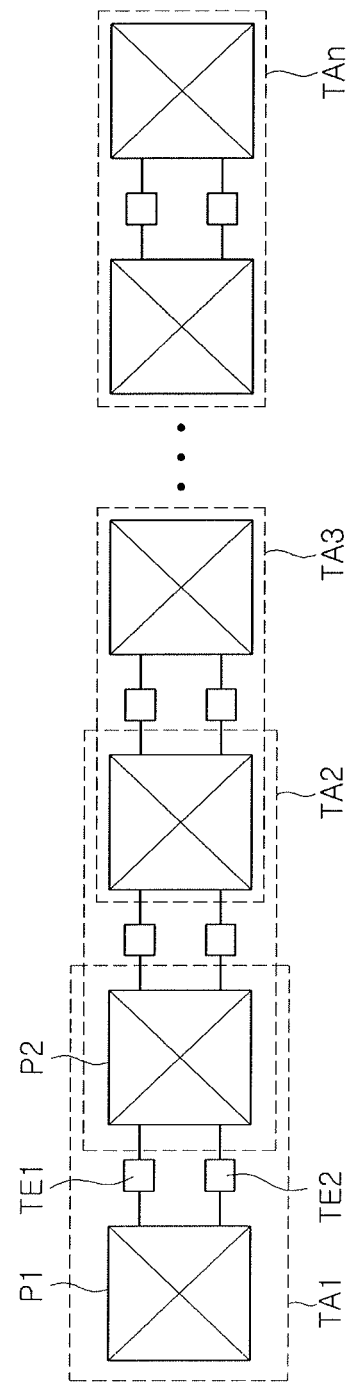
FIG. 3 illustrates an enlarged view of region B in FIG. 2.

FIG. 3 is an enlarged view of region B in FIG. 2. Referring to FIG. 3, a semiconductor device 10 according to an example embodiment may include a plurality of test regions TA1 to TAn. In an example embodiment, one test region TA1 may include first and second pads P1 and P2, with first and second test elements TE1 and TE2 connected therebetween. The first and second test elements TE1 and TE2 may be connected to each other in parallel between the first and second pads P1 and P2. Also, and the first and second test elements TE1 and TE2 may be respectively connected to the first and second pads P1 and P2 in series.

In a test process for the semiconductor device 10, probes may be connected to the first and second pads P1 and P2, respectively. The first and second pads P1 and P2 may operate as an input pad and an output pad, respectively. A voltage may be supplied from the probes to the first and second pads P1 and P2. In an example embodiment, when a voltage supplied to the first pad P1 is greater than a voltage supplied to the second pad P2, the first pad P1 may operate as an input pad and the second pad P2 may operate as an output pad.

Current flowing between the first pad P1 and the second pad P2 may only pass through one of the first or second test elements TE1 and TE2. For example, when current flowing from the first pad P1 to the second pad P2 only passes through the first test element TE1, the level of voltage of the second pad P2, and the like, may be measured using the probe connected to (or brought into contact with) the second pad P2. As a result, a determination may be made as to whether the first test element TE1 is defective.

Referring to FIG. 3, at least a portion of the pads may be used in common by test regions TA1 to TAn adjacent to each other. In an example embodiment, the first test region TA1 may include one pair of pads P1 and P2 and one pair of test elements TE1 and TE2. In this case, one pad P2 between the pads may be shared by the second test region TA2, adjacent to the first test region TA1. Because test regions TA1 to Tan that are adjacent to each other share one pad, a relatively large amount of test elements TE1 and TE2 may be provided in a limited region.

Figure 4:
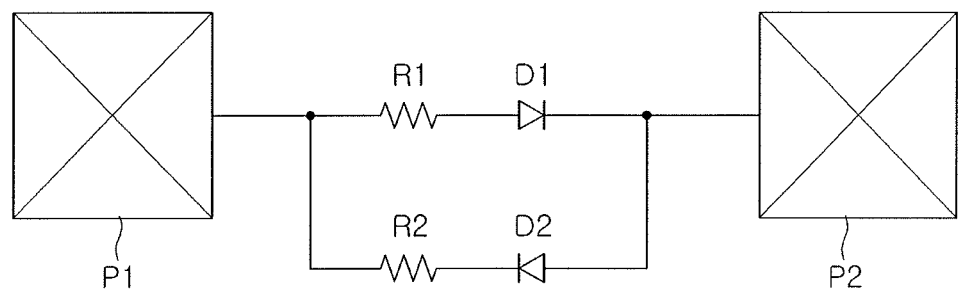
FIG. 4 illustrates an embodiment of a test region in a semiconductor device.

FIG. 4 illustrates an embodiment of a test region in a semiconductor device. Referring to FIG. 4, the test region may include first and second pads P1 and P2, first and second resistors R1 and R2, and first and second diodes D1 and D2. In the example embodiment in FIG. 4, the first and second resistors R1 and R2 may be test elements to verify whether or not a defect is present. One or more other devices, such as a capacitor, a transistor, a diode, and the like, may be included with the diodes and resistors in another embodiment.

The first and second resistors R1 and R2 may be respectively connected between the first and second pads P1 and P2 and may be connected to each other in parallel. The first and second diodes D1 and D2 may be connected to the first and second resistors R1 and R2 in series, respectively. Directions in which the first and second diodes D1 and D2 are connected may be opposite to each other. In an example embodiment, the first and second diodes D1 and D2 may not be turned on simultaneously. For example, when one of two diodes is turned on, the other diode may be turned off.

The first and second pads P1 and P2 may be connected to (or brought into contact with) the probes of the test devices, in order to receive a predetermined level of voltage therefrom. For example, when a relatively high voltage is supplied to the first pad P1, the first diode D1 is turned on and the test device may detect the level of current from the second pad P2. When a relatively high voltage is supplied to the second pad P2, the second diode D2 is turned on and the test device may detect the level of current from the first pad P1. Because the test device detects the level of current from one of the first or second pads P1 and P2 based on a voltage supply condition, a determination may be made as to whether or not an open defect has occurred in the first and second resistors R1 and R2. For example, because the first and second diodes D1 and D2 are connected in opposite directions, whether or not resistors R1 and R2 are defective may be verified using one pair of pads P1 and P2.

Figure 5:
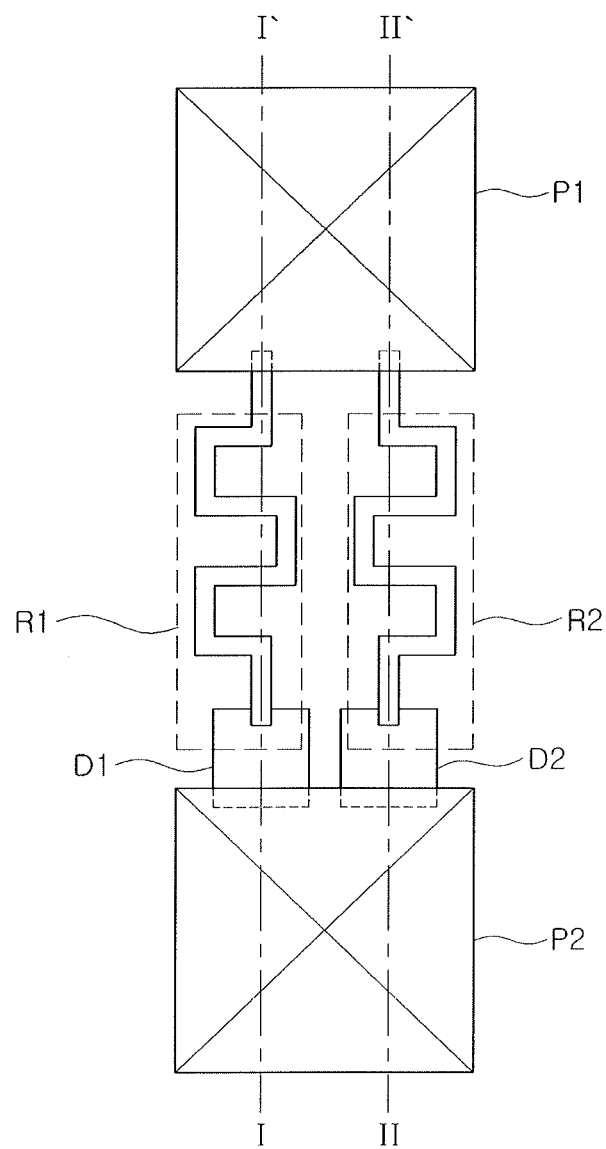
FIG. 5 illustrates a plan view of the test region in FIG. 4.

FIG. 5 is a plan view of the test region in FIG. 4. Referring to FIG. 5, the first and second resistors R1 and R2 in the test region may be implemented, for example, as a resistive-type wire. The first and second resistors R1 and R2 may be formed in the same process as at least one of the processes of resistance elements in the chip regions 11 in FIG. 1. When the existence or absence of a defect in the first and second resistors R1 and R2 is verified, a determination may also be made as to whether the at least one resistance element in the chip region 11 is defective.

The first and second diodes D1 and D2 may be between the first and second resistors R1 and R2 and the second pad P2. The first and second diodes D1 and D2 may allow currents to flow in different directions, in the same manner as the circuit in FIG. 4.

Figure 6:
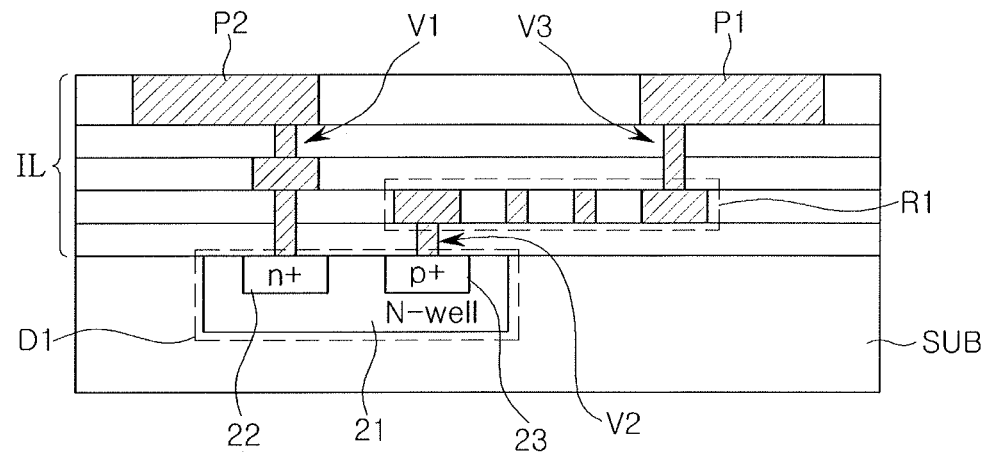
FIG. 6 illustrates a view of the test region taken along section line I-I' in FIG. 5.
Figure 7:
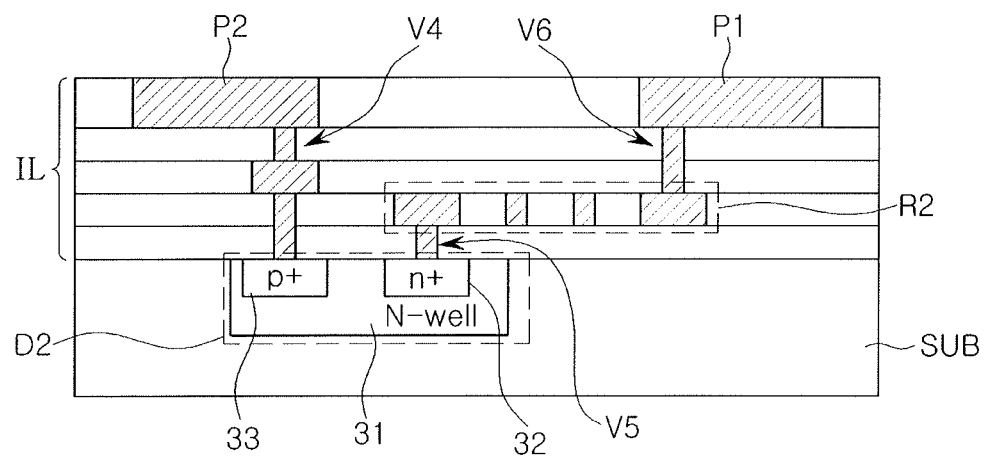
FIG. 7 illustrates a view of the test region taken along section line II-II' in FIG. 5.

FIG. 6 is a cross-sectional view of the test region taken along line I-I' in FIG. 5, and FIG. 7 is a cross-sectional view of the test region taken along line II-II' in FIG. 5.

Referring to FIG. 6, a first diode D1 may be formed in a substrate SUB. The first diode D1 may be formed by forming an N-well 21 using an N-type impurity injected into the substrate SUB and by forming a cathode 22 and an anode 23 using N-type and P-type impurities respectively injected into the N-well 21. As illustrated in FIG. 6, the cathode 22 may be connected to the second pad P2 through a first via V1, and the anode 23 may be connected to the first resistor R1 through a second via V2. The first resistor R1 may be connected to the first pad P1 through a third via V3.

In the example embodiment of FIG. 6, an insulating layer IL including a plurality of layers are provided on the substrate SUB, and the first resistor R1 may be in the insulating layer IL. The first resistor R1 may be electrically connected to the first and second pads P1 and P2, the first diode D1, and the like, through one or more of the vias V1, V2, and V3. The structure and disposition of the first diode D1, the first resistor R1, and the first and second pads P1 and P2 may be different in other embodiments. The first diode D1 may be, for example, a P-type diode.

Referring to FIG. 7, a second diode D2 may be formed in the substrate SUB. The second diode D2 may be connected to the second pad P2 through a fourth via V4 and may be connected to the second resistor R2 through a fifth via V5. The second resistor R2 may be on the same level as the first resistor R1, and the second diode D2 may have a structure similar to the first diode D1. In an example embodiment, the first diode D1 and the second diode D2 may be formed simultaneously.

The first diode D1 and the second diode D2 may respectively include a cathode and an anode, positions of which are reversed with respect to each other. For example, a cathode 32 of the second diode D2 may be connected to the second resistor R2, and an anode 33 of the second diode D2 may be connected to the second pad P2. Thus, when a voltage supplied to the first pad P1 is greater than a voltage supplied to the second pad P2, the second diode D2 may be turned off and only the first diode D1 may be turned on.

Conversely, when a voltage supplied to the first pad P1 is less than a voltage supplied to the second pad P2, the first diode D1 may be turned off and only the second diode D1 may be turned on. A pad receiving a relatively high voltage, among the first and second pads P1 and P2, may operate as an input pad. A pad receiving a relatively low voltage may operate as an output pad.

Figure 8:
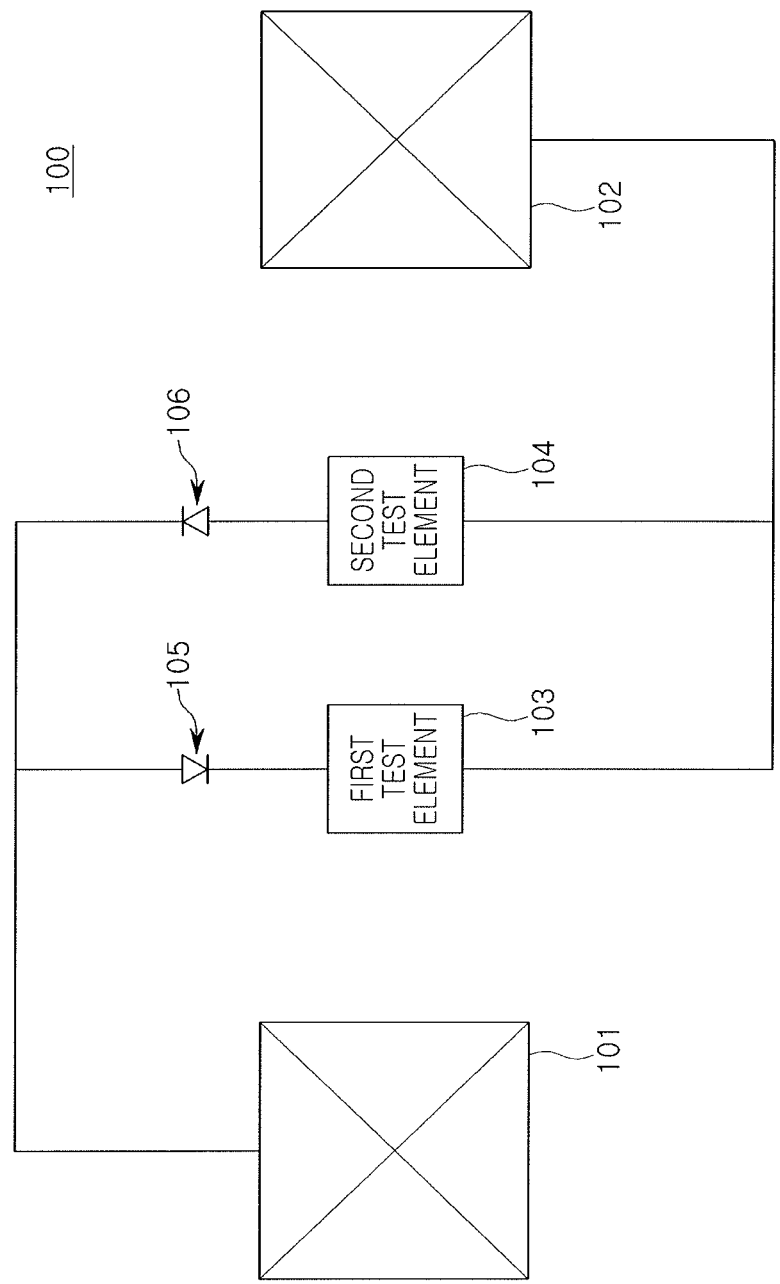
FIGS. 8 to 10 illustrate examples of operations performed in a test region.
Figure 9:
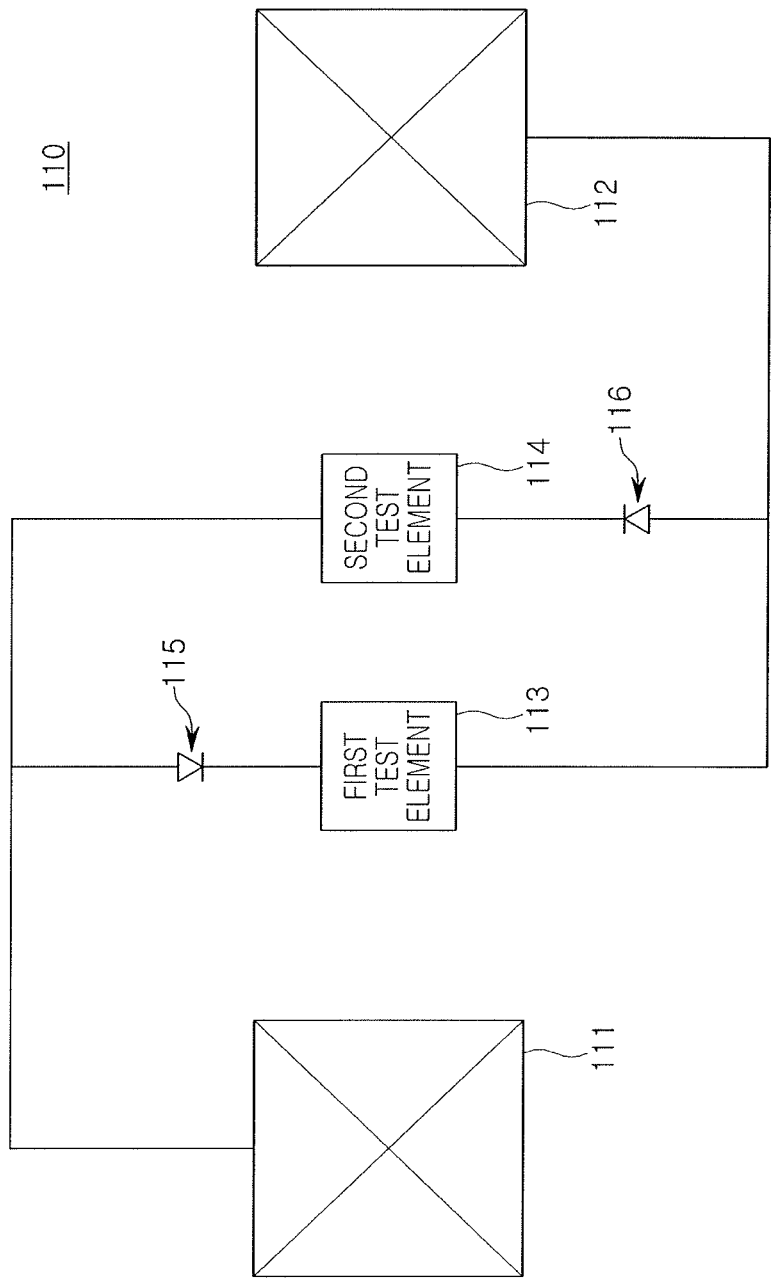
Figure 10:
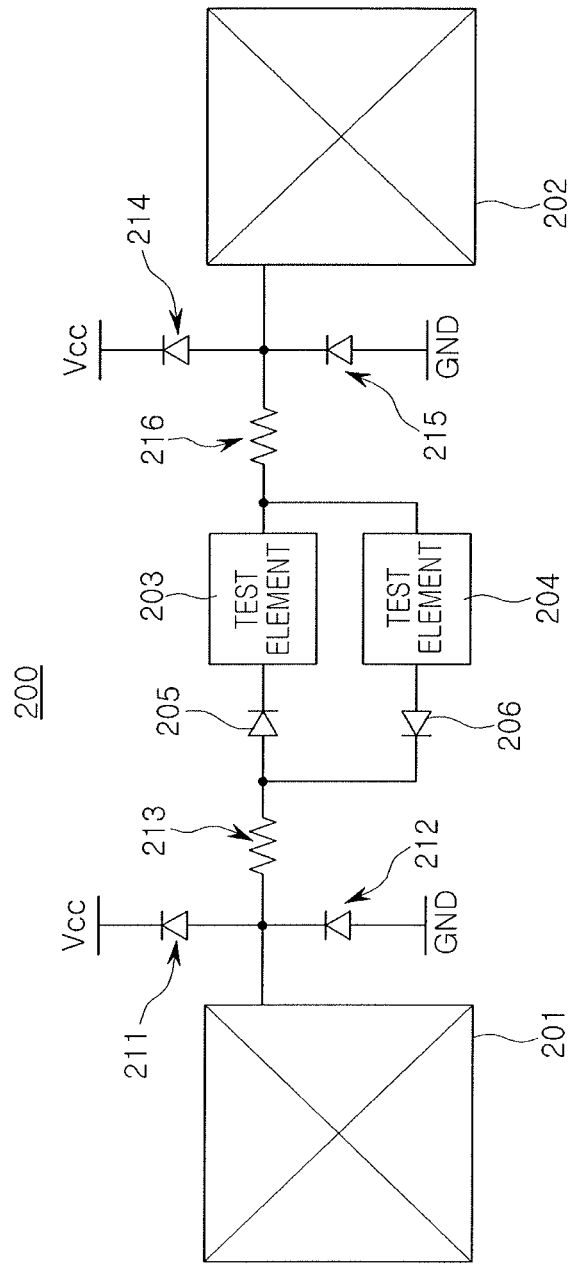

FIGS. 8 to 10 illustrate example embodiments and corresponding operations performed in test regions of a semiconductor device. Referring to FIG. 8, a test region 100 may include first and second pads 101 and 102, first and second test elements 103 and 104, and first and second diodes 105 and 106. The first and second test elements 103 and 104 may be respectively connected to the first and second pads 101 and 102. The first and second test elements 103 and 104 may be connected in parallel between the first and second pads 101 and 102.

The first and second test elements 103 and 104 may be respectively connected to the first and second diodes 105 and 106 in series. The first and second diodes 105 and 106 are connected in opposite directions. Referring to the example embodiment in FIG. 8, the first diode 105 may be connected between the first test element 103 and the first pad 101, an anode of the first diode 105 may be connected to the first pad 101, and a cathode of the first diode 105 may be connected to the first test device 103. The second diode 106 may be connected between the second test element 104 and the first pad 101, an anode thereof may be connected to the second test element 104, and a cathode thereof may be connected to the first pad 101.

When the level of voltage supplied to the first and second pads 101 and 102 increases or decreases, only one of the first or second diodes 105 and 106 may be turned on. Thus, current may only flow in one of the first and second test devices 103 and 104.

For example, when the voltage supplied to the first pad 101 is greater than the voltage supplied to the second pad P2, the first pad P1 may operate as an input pad and the second pad P2 may operate as an output pad. Because the first diode 105 is turned on when the second diode 106 is turned off, current may only flow in the first test element 103. By measuring a level of voltage of the second pad 102 using a probe in contact with the second pad 102, a determination may therefore be made as to whether or not the first test element 103 is defective.

When the voltage supplied to the second pad 102 is greater than the voltage supplied to the first pad 101, the second pad 102 may operate as an input pad and the first pad 101 may operate as an output pad. Thus, the second diode 106 is turned on when the first diode 105 is turned off. Whether or not the second test element 104 is defective may therefore be verified.

Referring to FIG. 9, first and second diodes 115 and 116 may be connected to different pads 111 and 112. In a test region 110, the first diode 115 may be connected between a first test element 113 and the first pad 111, and the second diode 116 may be connected between a second test element 114 and the second pad 112. The first and second diodes 115 and 116 may be connected to the first and second test elements 113 and 114, respectively, so that current flows in different directions. The connection and disposition structure of the pads 111 and 112, the test elements 113 and 114, and the diodes 115 and 116 may be different in other embodiments.

Referring to FIG. 10, a test region 200 may include protective diodes 211, 212, 214, and 215 connected to first and second pads 201 and 202. The protective diodes 211, 212, 214, and 215 may protect the respective pads 201 and 202, test elements 203 and 204, and the like, from electrostatic discharge (ESD).

In an example embodiment, the first pad 201 may be connected to a first p-type diode 211 and a first n-type diode 212. The cathode of the first p-type diode 211 may be connected to a power supply voltage VCC, and the anode of the first n-type diode 212 may be connected to a reference or ground voltage GND. Positive static electricity input from the first pad 201 may escape as the power supply voltage VCC through the first p-type diode 211. Negative static electricity input from the first pad 201 may escape as the ground voltage GND through the first n-type diode 212. Thus, the static electricity input from the first pad 201 may be prevented from being transferred to the test elements 203 and 204 and the diodes 205 and 206. Operations of a second p-type diode 214 and a second n-type diode 215 connected to the second pad 202 may be similar to those of the first p-type diode 211 and the first n-type diode 212.

The first and second pads 201 and 202 may be connected to protective resistors 213 and 216. The protective resistors 213 and 216 may be connected to nodes between the p-type diodes 211 and 214 and the n-type diodes 212 and 215. When, for example, a high voltage or a high current momentarily flows thereto through the first and second pads 201 and 202, the protective resistors 213 and 216 may allow the high voltage and high current to be consumed, thereby preventing damage to the test elements 203 and 204 and the diodes 205 and 206.

The first and second test elements 203 and 204 may be respectively connected to the first and second diodes 205 and 206 between first and second pads 201 and 202. The connection relationships and operations of the first and second test elements 203 and 204 and the first and second diodes 205 and 206 may be similar to those in FIGS. 8 and 9.

In the example embodiment of FIG. 10, the first and second diodes 205 and 206 may be formed, for example, using the same process as that of the protective diodes 211, 212, 214, and 215. The protective diodes 211, 212, 214, and 215 may be formed at the same time as and using the same process used to form the first and second diodes 205 and 206. Thus, an increase in manufacturing process stages may be prevented.

Figure 11:
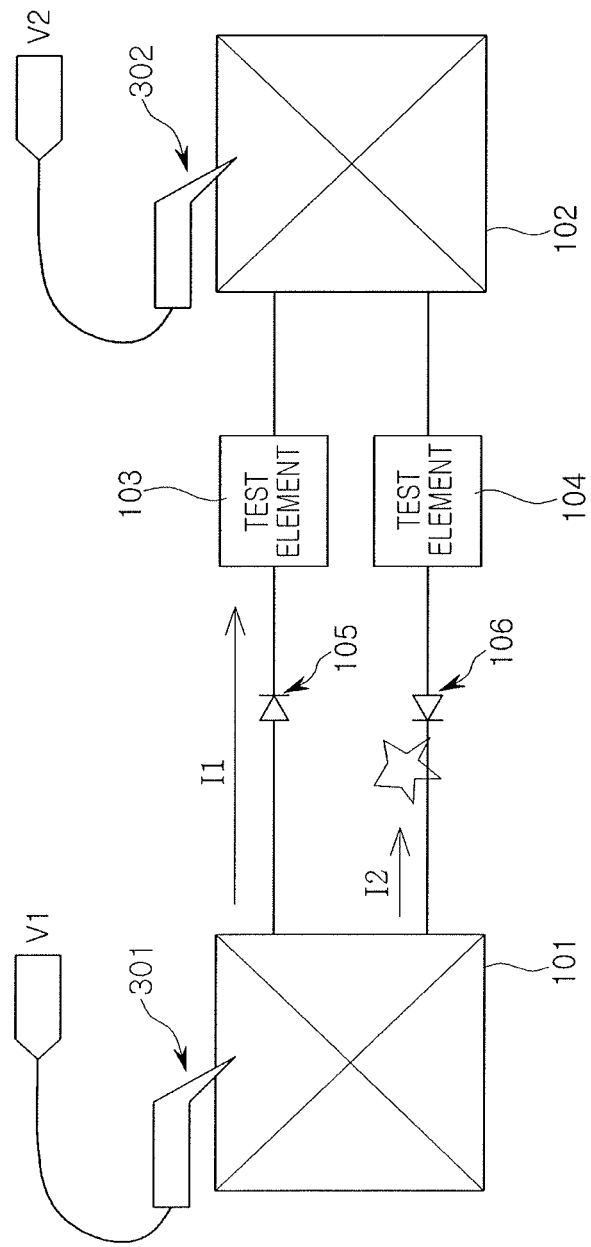
FIGS. 11 and 12 illustrate an embodiment of a method for verifying a test device in a semiconductor device.
Figure 12:
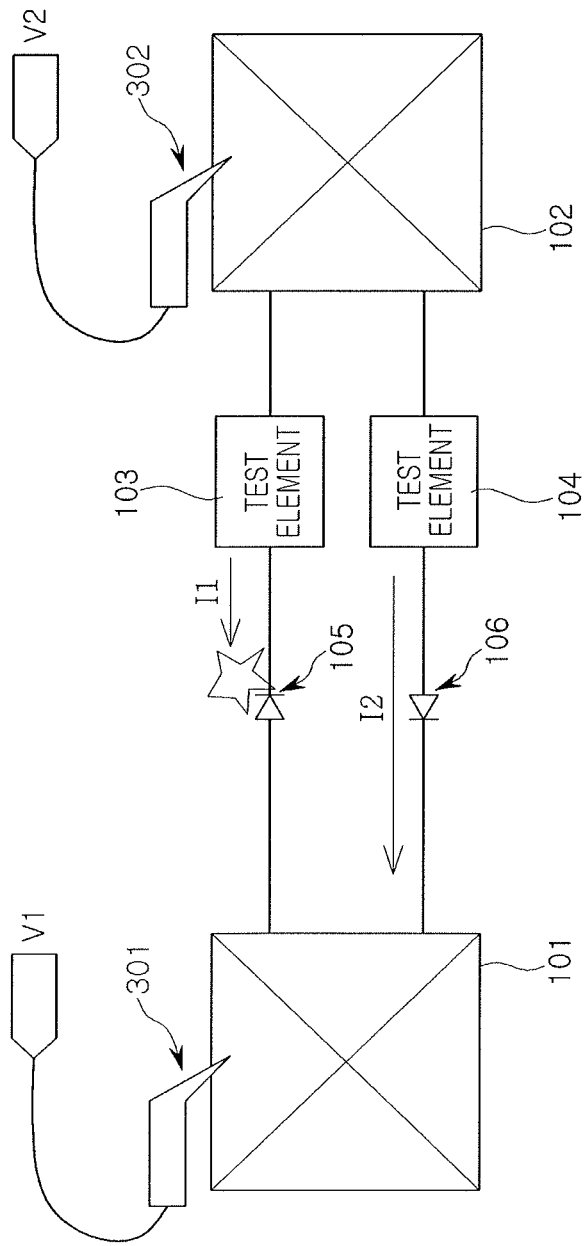

FIGS. 11 and 12 illustrate an embodiment of a method for verifying a test device in a semiconductor device. Referring to FIGS. 11 and 12, in order to verify test elements 103 and 104, first and second probes 301 and 302 of external test device may be brought into contact with first and second pads 101 and 102, respectively, to supply different levels of voltages V1 and V2. First, with reference to FIG. 11, a first voltage V1 supplied from the first probe 301 in contact with the first pad 101 may be greater than a second voltage V2 supplied from the second probe 302 in contact with the second pad 102.

When the first voltage V1 is greater than the second voltage V2, current may flow from the first pad 101 to the second pad 102. Thus, the first diode 105 may be biased in a forward direction and turned on and the second diode 106 may be biased in a reverse direction and be turned off. For example, a first current I1 may flow in a first test element 103 and a second current I2 flowing toward a second test element 104 may be blocked by the second diode 106. By measuring the level of voltage of the second pad 102 operating as an output pad using the test device, whether or not the first test element 103 is defective may be verified.

When the voltage of the second pad 102 is detected to be excessively high or low (e.g., above or below a reference value), the first test element 103 may be determined to be defective. For example, when the first test element 103 is a resistor, the first current I1 may be determined based on the first and second voltages V1 and V2. Thus, the first current I1 may be detected from the second pad 102. When the first current I1 detected from the second pad 102 is excessively low, the test device may determine that an open defect has occurred in the first test element 103. When the first test element 103 is a capacitor and the first current I1 detected from the second pad 102 is excessively high, the test device may determine that a short defect has occurred in the first test element 103.

Referring to FIG. 12, in a manner similar to FIG. 11, first and second probes 301 and 302 of an external test device may be brought into contact with first and second pads 101 and 102, respectively, to supply different levels of voltages V1 and V2. However, different from FIG. 11, a second voltage V2 may be greater than a first voltage V1 in an example embodiment of FIG. 12. Thus, the second pad 102 may operate as an input pad, and the first pad 101 may operate as an output pad.

Since the second voltage V2 has a greater level than the first voltage V1, a first diode 105 may be biased in a reverse direction and be turned off and a second diode 106 may be biased in a forward direction and be turned on. Thus, as illustrated in FIG. 12, a first current I1 supplied to the first test element 103 may not be transferred to the first pad 101 serving as an output pad. A second current I2 passing through the second test element 104 may be transferred to the first pad 101.

The test device may determine whether or not the second test element 104 is defective by comparing the level of the second current I2 measured from the first pad 101 to a predetermined reference level. In an example embodiment, when the level of the second current I2 exceeds the reference level, the test device may determine that a short defect has occurred in the second test element 104. The second test element 104 may be, for example, a capacitor, formed, for example, from conductive patterns separated from each other. When the level of the second current I2 is less than the reference level, the test device may determine that an open defect has occurred in the second test element 104. The second test element 104 may be, for example, a resistor.

In the example embodiments illustrated in FIGS. 11 and 12, the test device may detect the level of the first current I1 or the second current I2 to detect an open defect or a short defect of the test elements 103 and 104. In an example embodiment, when the test elements 103 and 104 are resistors, the test device may detect that an open defect is or is not present in the resistors based on the first or second current I1 or I2. When the test elements 103 and 104 are capacitors, the test device may detect that a short defect is or is not present in the capacitors based on the first or second current I1 or I2.

Tables 1 and 2 illustrate an embodiment of a method for determining the occurrence of open and short defects when the test elements 103 and 104 are resistors and capacitors.

TABLE 1

| Current Detection Result | Voltage Condition V1 > V2 | Voltage Condition V1 < V2 |
| --- | --- | --- |
| LOW CURRENT | Open Defect in First Test Element | Open Defect in Second Test Element |
| HIGH CURRENT | First Test Element Normal | Second Test Element Normal |

TABLE 2

| Current Detection Result | Voltage Condition V1 > V2 | Voltage Condition V1 < V2 |
| --- | --- | --- |
| LOW CURRENT | First Test Element Normal | Second Test Element Normal |
| HIGH CURRENT | Short Defect in First Test Element | Short Defect in Second Test Element |

As previously described with reference to FIGS. 11 and 12, in example embodiments, respective on/off operations of the first and second diodes 105 and 106 may be determined based on relatively high or low levels of the first and second voltages V1 and V2 supplied to the first and second pads 101 and 102. For example, since the input and output pads are determined depending on the high or low level of the first and second voltages V1 and V2, the first and second test elements 103 and 104 may be connected to two pads 101 and 102 to be verified. Thus, a relatively large amount of test elements 103 and 104 may be in a limited spatial region.

Figure 13:
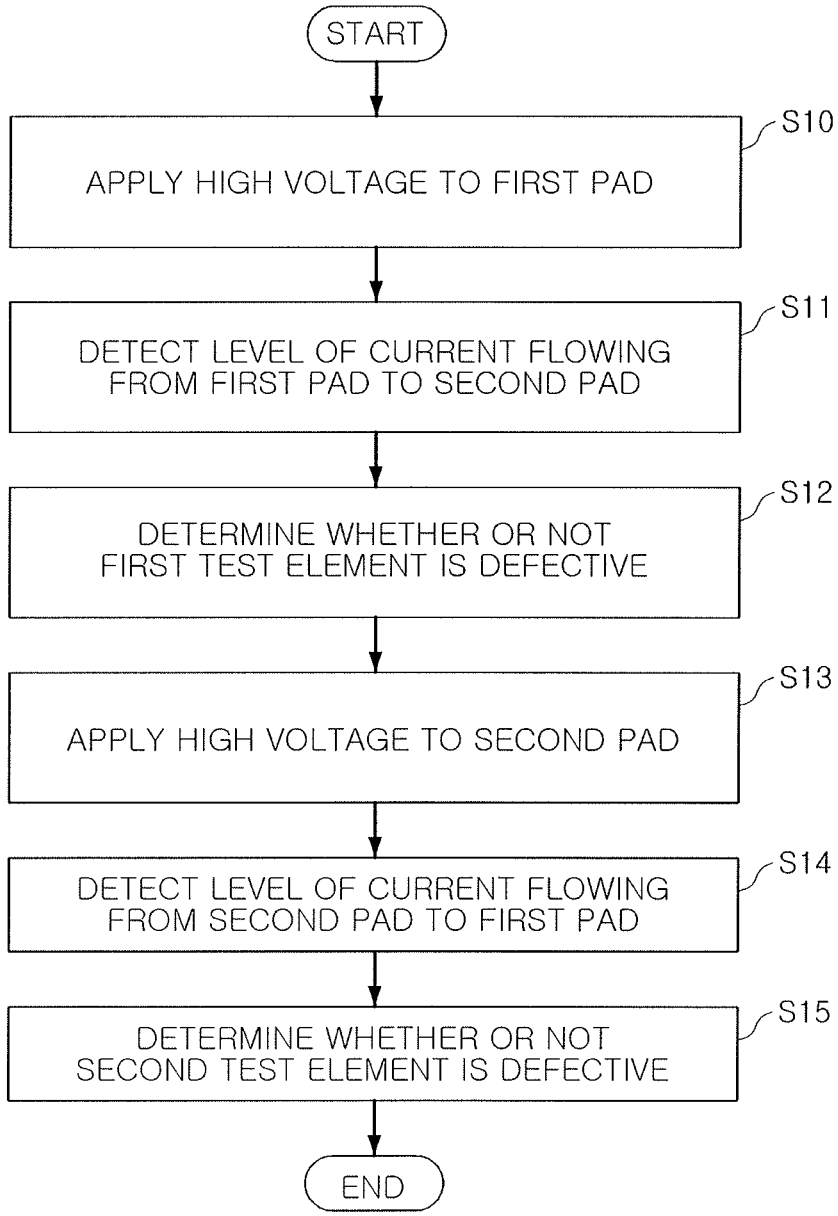
FIG. 13 illustrates examples operations of a semiconductor device.

FIG. 13 illustrates an example of verification operations of a semiconductor device described with reference to FIGS. 11 and 12. Referring to FIG. 13, a test device may apply a predetermined (e.g., relatively high) voltage to a first pad 101 through probes 301 and 302, in S10. The relatively high voltage applied to the first pad 101 may indicate that the voltage applied to the first pad 101 has a greater level than a voltage applied to the second pad 102, formed as a pair with the first pad 101. Based on the voltage bias conditions described above, the first pad 101 may operate as an input pad and the second pad 102 may operate as an output pad.

For example, when a relatively high voltage is supplied to the first pad 101, the test device may detect the level of current flowing from the first pad 101 to the second pad 102, in S11. The current may be only the first current I1 flowing in the first test element 103 by the first diode 105 biased in a forward direction and the second diode 106 biased in a reverse direction. The current may be detected from the second pad 102 operating as an output pad. The level of current detected from the second pad 102 may be compared to a predetermined reference level. Based on the comparison result, a determination may be made as to whether or not the first test element 103 is defective, in S12. When the first current I1 has a level greater than an upper limit of the reference level range, the test device may determine that a short defect has occurred in the first test element 103. When the first current I1 has a level less than a lower limit of the reference level range, the test device may determine that an open defect has occurred in the first test element 103.

Under the bias condition that a relatively high voltage is applied to the first pad 101, and when the verification of the first test element 103 is completed, the test device may apply a relatively high voltage to the second pad 102 through the probes 301 and 302, in S13. In a manner similar to operation S10, a voltage bias condition in S13 may be understood as a condition in which a voltage applied to the second pad 102 has a level greater than the voltage applied to the first pad 101.

While the relatively high voltage is applied to the second pad 102, the test device may detect a level of current flowing from the second pad 102 to the first pad 101, in S14. The current detected in S14 may be the second current I2 flowing in the second test element 104 by the second diode 106 biased in a forward direction. The test device may determine whether or not the second test element 104 is defective by comparing a level of the second current I2 to a predetermined reference level range.

In an example embodiment, the first test element 103 and the second test element 104 may include different types of elements. In this case, reference level ranges for the first current I1 and second current I2 in operations S13 and S16 may be different.

When the first and second test elements 103 and 104 include different types of elements, the test device may detect different parameters from an output pad, to thereby verify the first and second test elements 103 and 104. For example, when the first test element 103 is a resistor, the test device may determine whether or not the first test element 103 is defective by detecting the level of current from the second pad 104. When the second test element 104 is a capacitor, the test device may supply current through the second pad 102, serving as an input pad, and may detect the level of voltage from the first pad 101, thereby determining whether or not the second test element 104 is defective.

Various verification methods may be used based on the type of the first and second test elements 103 and 104. The first and second pads 101 and 102 may operate as an input pad and an output pad, respectively, based on the types of the first and second test elements 103 and 104. In the example embodiment, since two test elements may be verified using two pads, the degree of integration of test elements may be increased and a limited region thereof may thus be used more efficiently.

Figure 14:
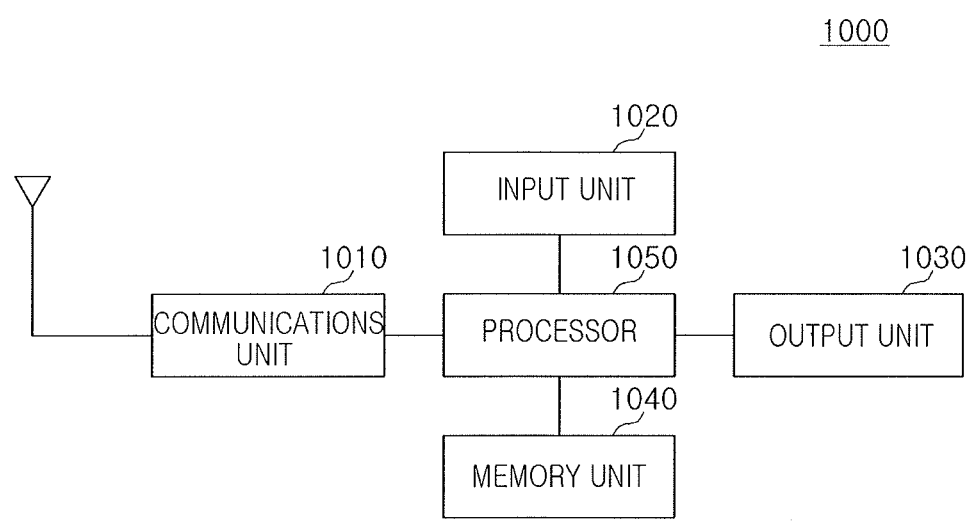
FIG. 14 illustrates an embodiment of an electronic device.

FIG. 14 illustrates an embodiment of an electronic device 1000 which may include a communications unit 1010, an input unit 1020, an output unit 1030, a memory unit 1040 and a processor 1050. The communications unit 1010 may include a wired/wireless communications module, and may include a wireless internet module, a near field communications module, a global positioning system (GPS) module, a mobile communications module, etc. The wired/wireless communications module included in the communications unit 1010 may be connected to an external communications network by various communications protocols to transmit and receive data.

The input unit 1020 may include a mechanical switch, a touchscreen, a voice recognition module, or the like, provided as a module allowing a user to control an operation of the electronic device 1000. In addition, the input unit 1020 may include a mouse operated using a track ball or laser pointer scheme, or the like, or may include a finger mouse device. Further, the input unit 1020 may include various sensor modules through which data is input by a user.

The output unit 1030 may output information processed by the electronic device 1000, in the form of voice or image, and the memory unit 1040 may store a program for processing and control of the processor 1050, data, or the like. The processor 1050 may transfer a command to the memory unit 1040 to perform various operations and to store data or retrieve data therefrom.

The memory unit 1040 may communicate with the processor 1050 through an interface in the electronic device 1000 or through a separate interface. When the memory unit 1040 communicates with the processor 1050 through a separate interface, the processor 1050 may store data in or draw data out of the memory unit 1040 through various interface specifications such as SD, SDHC, SDXC, MICRO SD, USB, etc.

The processor 1050 may control operations of respective parts in the electronic device 1000. The processor 1050 may control and process data relevant to voice communications, videotelephony, data communications, or the like, or relevant to multimedia reproduction and management. In addition, the processor 1050 may process an input by a user through the input unit 1020 and may output the processed results through the output unit 1030.

Further, the processor 1050 may store data for controlling operation of the electronic device 1000 in the memory unit 1040 or may draw the data from the memory unit 1040. In a process of manufacturing the processor 1050, the memory unit 1040, the communications unit 1010, and the like, a test region according to an example embodiment may be applied thereto, to thereby verify whether or not a defect occurs in the manufacturing process.

The methods, processes, and/or operations described herein may be performed, at least partially, by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The controllers and other processing features described herein may be implemented in logic which, for example, may include hardware, software, or both. When implemented at least partially in hardware, the controllers and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

In accordance with one embodiments, a semiconductor device includes N pads; M test elements; and at least one integrated circuit, wherein the M test elements are connected between the N pads and the at least one integrated circuit is adjacent to the N pads and M test elements, and wherein current is to bi-directionally flow between the N pads through the M test elements at different times, current output by the M test elements indicative of a defect in the semiconductor device.

In accordance with one or more of the aforementioned embodiments, one pair of test elements connected to each other in parallel may be connected between one pair of pads, and diodes may be connected between at least one pad and respective test elements in different directions. Thus, whether one pair of test elements are defective may be respectively determined according to a direction of current flowing between one pair of pads. As a result, two test elements may be connected between one pair of pads, thereby increasing the degree of integration of test elements.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A semiconductor device, comprising:
a substrate;
first and second pads on the substrate, the first and second pads separated from each other;
first and second test elements on the substrate, the first and second test elements connected to the first and second pads and connected to each other in parallel between the first and second pads; and
first and second diodes being adjacent to each other in the substrate, the first and second diodes connected to each other between the first and second pads in parallel and in opposite directions, wherein;
the first pad, the first diode, the first test element, and the second pad are connected to each other in series, and
the first pad, the second diode, the second test element, and the second pad are connected to each other in series, and wherein
the first and second test elements are for determining whether a semiconductor process for the semiconductor device is properly performed through performing a short defect test on each of the first and second test elements with using the first and second pads, wherein:
the first and second pads are adjacent to each other at a first level,
the first and second test elements are adjacent to each other at a second level lower than the first level, and
the first and second diodes are adjacent to each other at a third level lower than the first level.

2. The semiconductor device as claimed in claim 1, wherein the first diode is to be turned on and the second diode is to be turned off when a voltage greater than a voltage supplied to the second pad is supplied to the first pad.

3. The semiconductor device as claimed in claim 2, wherein a level of current flowing from the first pad to the second pad based on the greater voltage indicates that the first test element is defective.

4. The semiconductor device as claimed in claim 1, wherein the first diode is to be turned off and the second diode is to be turned on when a voltage greater than a voltage supplied to the first pad is supplied to the second pad.

5. The semiconductor device as claimed in claim 4, wherein a level of current flowing from the second pad to the first pad based on the greater voltage indicates that the second test element is defective.

6. The semiconductor device as claimed in claim 1, wherein:
the first diode is connected between the first pad and the first test element, and
the second diode is connected between the first pad and the second test element.

7. The semiconductor device as claimed in claim 6, wherein:
the first diode includes an anode connected to the first pad and a cathode connected to the first test element, and
the second diode includes a cathode connected to the first pad and an anode connected to the second test element.

8. The semiconductor device as claimed in claim 1, wherein:
the first diode is connected between the first pad and the first test element, and
the second diode is connected between the second pad and the second test element.

9. The semiconductor device as claimed in claim 8, wherein:

the first diode includes an anode connected to the first pad and a cathode connected to the first test element, and the second diode includes an anode connected to the second pad and a cathode connected to the second test element.

10. The semiconductor device as claimed in claim 1, wherein the semiconductor device further includes a protective diode.

11. The semiconductor device as claimed in claim 1, wherein the first and second test elements include at least one of a resistor, a capacitor, or a semiconductor element.

12. The semiconductor device as claimed in claim 1, further comprising:
- a plurality of chip regions, each of which includes at least one integrated circuit chip; and
- a division region between adjacent ones of the chip regions and including at least one test region, wherein:
- the at least one test region includes the first and second pads, the first and second test elements, the first diode, and the second diode,
- the first diode is connected between one of the first or second pads and the first test element, to allow a current to flow in a first direction, and
- the second diode is connected between one of the first or second pads and the second test element to allow a current to flow in a second direction different from the first direction.

13. The semiconductor device as claimed in claim 1, further comprising:
- a third pad;
- third and fourth test elements; and
- third and fourth diodes, wherein:
- the first pad, the first diode, the first test element, the second pad, the third diode, the third test element, and the third pad are connected to each other in series, and
- the first pad, the second diode, the second test element, the second pad, the fourth diode, the fourth test element, and the third pad are connected to each other in series.

14. The semiconductor device as claimed in claim 1, wherein:
- the first pad, the first diode, the first test element, and the second pad are connected to each other in series through first vias, and
- the first pad, the second diode, the second test element, and the second pad are connected to each other in series through second vias.

15. The semiconductor device as claimed in claim 1, wherein:
- the first and second pads are adjacent to each other at the first level in a first horizontal direction,
- the first and second test elements are adjacent to each other at the second level in a second horizontal direction perpendicular to the first horizontal direction, and
- the first and second diodes are adjacent to each other at the third level in the second horizontal direction.

16. The semiconductor device as claimed in claim 1, wherein:
- the third level is lower than the second level.

17. A semiconductor device, comprising:
- a plurality of chip regions, each of which includes at least one integrated circuit chip; and
- a division region between adjacent ones of the chip regions and including at least one test region, wherein the at least one test region includes:
- a substrate;
- first and second pads on the substrate, the first and second pads separated from each other;
- first and second test elements on the substrate, the first and second test elements connected between the first and second pads and connected to each other in parallel; and
- first and second diodes being adjacent to each other in the substrate, the first and second diodes connected to each other between the first and second pads in parallel and in opposite directions, wherein:
- the first pad, the first diode, the first test element, and the second pad are connected to each other in series, and
- the first pad, the second diode, the second test element, and the second pad are connected to each other in series, wherein:
- the first diode is connected between one of the first and second pads and the first test element, to allow current to flow in a first direction, and
- the second diode is connected between one of the first and second pads and the second test element, to allow current to flow in a second direction different from the first direction, and wherein
- the first and second test elements are for determining whether a semiconductor process for the semiconductor device is properly performed through performing a short defect test on each of the first and second test elements with using the first and second pads, wherein:
- the first and second pads are adjacent to each other at a first level,
- the first and second test elements are adjacent to each other at a second level lower than the first level, and
- the first and second diodes are adjacent to each other at a third level lower than the first level.

18. The semiconductor device as claimed in claim 17, wherein the division region includes a scribe line.

19. The semiconductor device as claimed in claim 17, wherein the first and second test elements are different types of circuit elements.

20. The semiconductor device as claimed in claim 17, wherein:
- the third level is lower than the second level.

* * * * *